United States Patent [19]

Mattison

[11] Patent Number: 5,367,204
[45] Date of Patent: Nov. 22, 1994

[54] MULTIPLE DIGITAL CLOCK EDGE GENERATOR CIRCUIT AND METHOD

[75] Inventor: Phillip E. Mattison, Gilbert, Ariz.

[73] Assignee: VLSI Technology, Inc., San Jose, Calif.

[21] Appl. No.: 939,502

[22] Filed: Sep. 1, 1992

[51] Int. Cl.$^5$ .................. H03K 5/153; H03K 5/04
[52] U.S. Cl. ........................... 327/75; 327/259; 327/295; 327/141
[58] Field of Search ............. 307/269, 360, 361, 480, 307/511, 517, 265, 260; 328/63, 72, 155

[56] References Cited

U.S. PATENT DOCUMENTS

| | | | |
|---|---|---|---|
| 3,714,470 | 1/1973 | Goldberg | 307/261 |
| 3,906,247 | 9/1975 | Heffner | 307/293 |
| 3,987,392 | 10/1976 | Kugelmann et al. | 307/360 X |
| 4,245,167 | 1/1981 | Stein | 307/265 |
| 4,375,082 | 2/1983 | Lohrmann | 307/265 X |
| 4,404,481 | 9/1983 | Ide et al. | 307/491 |
| 4,509,494 | 4/1985 | Nishitoba et al. | 307/265 X |
| 4,529,892 | 7/1985 | Reilly et al. | 307/361 |
| 4,603,357 | 7/1986 | Ramirez et al. | 360/46 |
| 4,740,964 | 4/1988 | Stalick | 370/110.1 |
| 4,959,557 | 9/1990 | Miller | 307/265 |
| 5,097,143 | 3/1992 | Remson | 307/360 X |
| 5,272,729 | 12/1993 | Bechade et al. | 307/269 X |

*Primary Examiner*—Willis R. Wolfe
*Attorney, Agent, or Firm*—Harry M. Weiss & Associates

[57] ABSTRACT

A circuit for generating multiple clock edges from a single input clock is disclosed. This circuit has a digital clock input which causes a capacitor to charge and discharge with constant current sources, providing a linear voltage ramp. This linear voltage ramp is monitored by several comparators, each of which have a different reference voltage level, the outputs of which provide the multiple clock edges needed. In this manner, several outputs are generated, each of which has the same fundamental frequency as the input clock signal, but with varying duty cycles and delays from the clock edges of the input clock. In this manner, several clock edges are available for use in synchronous digital systems such as state machines that require precise timing relationships between inputs and clock signals.

12 Claims, 1 Drawing Sheet

5,367,204

MULTIPLE DIGITAL CLOCK EDGE GENERATOR CIRCUIT AND METHOD

FIELD OF THE INVENTION

This invention generally relates to electronic circuits and methods, and more specifically relates to a multiple digital clock edge generator circuit and method which has a digital clock signal input and generates multiple outputs of varying duty cycles of the same frequency as the input clock signal in order to provide a plurality of different clock edges which can be used for clocking purposes in a synchronous digital system. This circuit and method is especially useful in digital state machines where the relationship between data inputs and clock signals are critical.

DESCRIPTION OF THE PRIOR ART

In many synchronous digital applications such as a typical digital state machine, there is a need to generate very specific timing relationships between the digital input signals and their clocking signals. One method previously used to generate these specific timing relationships was to increase the frequency of the input clock, thereby providing the fundamental clock signal and several derivative clock signals for generating the precise timing relationships needed. As the required timing relationships became more precise, the clock speed was increased further to provide the needed resolution. This relatively high clock rate increased power dissipation in the circuit and created support circuitry that is relatively complex.

Therefore, there existed a need to generate in a simple manner several derivatives of the input clock signal without increasing the input clock frequency, such that many different clock edges are generated in response to the fundamental clock edges of the clock input signal, thereby meeting the tight timing requirements of a synchronous digital application such as a digital state machine.

SUMMARY OF THE INVENTION

It is an object of this invention to provide a multiple digital clock edge generator circuit and method which provides a plurality of output signals with varying clock edges which each have a precise relationship to the input clock signal.

It is another object of this invention to provide a multiple digital clock edge generator circuit and method which provides a plurality of output signals which have the same fundamental frequency as the input clock signal, but with varying duty cycles to provide clock edges that are delayed in varying degrees from the clock edges of the input clock signal.

It is a further object of this invention to provide a multiple digital clock edge generator circuit and method which uses the charging and discharging of a capacitor to generate a plurality of output signals with respect to the input clock signal.

According to the present invention, a circuit for generating multiple digital clock edges from a single clock input signal is provided. This circuit comprises a pair of constant current sources which are used to charge and discharge a capacitor depending on the phase of the input clock. The charging and discharging of the capacitor produces a linearly rising and falling voltage ramp which is fed into a resistor ladder comparator network. The output of the comparator network is a group of signals with different pulse widths and edge delays, but synchronous to the input clock signal and of the same fundamental frequency as the input clock signal. These outputs may be used to provide the precise timing relationships required in a typical synchronous digital system such as a digital state machine.

The simple circuit of the present invention provides a lowcost method of generating the timing signals required in a synchronous digital system. These timing signals are produced without increasing the input clock frequency or adding complex circuitry, thereby not increasing the power dissipation, and reducing cost compared to the prior art circuits and methods of generating the needed clock signals for a synchronous digital system.

The foregoing and other objects, features and advantages will be apparent from the following description of the preferred embodiment of the invention as illustrated in the accompanying drawings.

DESCRIPTION OF THE PREFERRED EMBODIMENT

Figure 1:
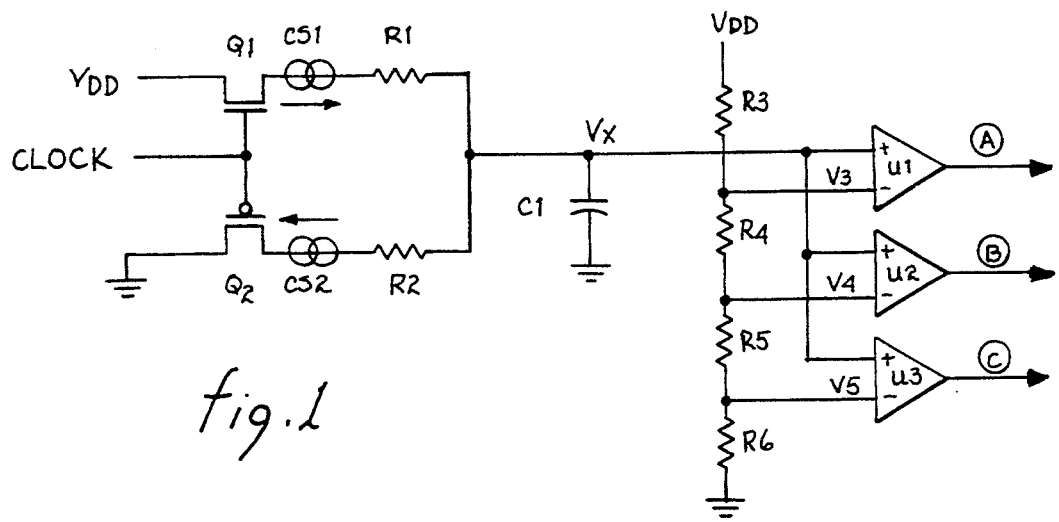
FIG. 1 is a schematic diagram of the multiple digital clock edge generator circuit of the present invention.

Referring to FIG. 1, the nominal configuration of the circuit of the present invention is disclosed. This circuit has one input labeled CLOCK, and three outputs labeled A, B, and C. The CLOCK input drives the gates of transistors Q1 and Q2 as shown. Both transistors Q1 and Q2 simply act as switches that are enabled on different phases of the CLOCK input. Transistor Q1 is turned on when CLOCK is high, while transistor Q2 is turned on when CLOCK is low. When Q1 is turned on (when CLOCK is high), Q2 is off, so the constant current source CS1 is coupled to VDD and charges capacitor C1 through resistor R1. When CLOCK goes low, Q1 turns off, Q2 turns on, which couples constant current source CS2 to ground, thereby discharging capacitor C1 through R2. Since the capacitor C1 is charged and discharged with constant current sources CS1 and CS2, which charge and discharge C1 at the same rate, the voltage Vx at C1 is a rising and falling ramp as shown by waveform 12 in FIG. 2.

Figure 2:
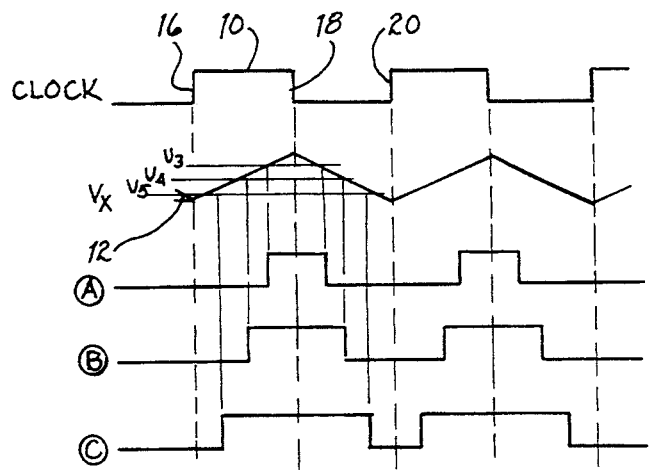
FIG. 2 is a timing diagram showing the timing response of the circuit of FIG. 1.

This ramp 12 rises and falls with respect to CLOCK 10 shown in FIG. 2. The state of ramp 12 is monitored by three comparators U1, U2 and U3 as shown in FIG. 1. The reference inputs to these comparators are fixed voltages V3, V4 and V5 defined by VDD and the resistors R3, R4, R5 and R6, the equations for which are shown below.

$$V3 = \frac{VDD(R4 + R5 + R6)}{R3 + R4 + R5 + R6}$$

$$V4 = \frac{VDD(R5 + R6)}{R3 + R4 + R5 + R6}$$

$$V5 = \frac{VDD \cdot R6}{R3 + R4 + R5 + R6}$$

Due to the resistor divider configuration of the reference voltages, $V5 < V4$ and $V4 < V3$. The reference voltages V3, V4 and V5 are connected to the inverting input of comparators U1, U2 and U3, respectively. The non-inverting inputs of comparators U1, U2 and U3 are all connected to capacitor C1 as shown so the ramp 12 will determine the outputs of comparators U1, U2 and U3. The outputs A, B and C of comparators U1, U2 and U3, respectively, are shown with respect to ramp 12 in FIG. 2. When CLOCK 10 makes the low-to-high transition 16 as shown, Q1 is turned on which causes CS1 to begin charging C1, causing the voltage Vx at C1 to rise. Initially Vx is less than V3, V4 and V5. As Vx rises, it increases until it reaches V5, at which point output C of U3 goes high. Vx continues to rise until it reaches V4, at which point output B of U2 goes high. Vx continues to rise until it reaches V3, at which point output A of U1 goes high. When CLOCK 10 makes the high-to-low transition 18 as shown in FIG. 2, Q2 turns on which causes CS2 to discharge C1 through R2. This discharging of C1 causes Vx to decrease. Vx falls to V3, at which point output A of U1 goes low. Vx continues to fall until it reaches V4, at which time output B of U2 goes low. Vx continues to fall until it reaches V5, at which time output C of U3 goes low. CLOCK 10 then makes a low-to-high transition 20 as shown, and the cycle is repeated.

As the waveforms of FIG. 2 demonstrate, the circuit of FIG. 1 takes a CLOCK input 10 and generates from this single input three outputs A, B and C. While each of these outputs have the same fundamental clock frequency as the CLOCK input 10, the edge delay from CLOCK 10 varies and the duty cycle varies. This circuit can therefore produce multiple digital clock signals at its outputs which can be selected and used as needed in a synchronous digital system.

The specific implementation of the circuit of the present invention as shown in FIG. 1 is shown for illustrative purposes only, as one possible implementation of the circuit of the present invention. The resistors R3, R4, R5 and R6 may be selected as required to set the thresholds for comparators U1, U2 and U3 to give the desired delays between the CLOCK input and the outputs. In addition, any number of outputs may be generated within the scope of the present invention. The specific implementation of the logic that performs the switching of the constant current sources CS1 and CS2 may vary within the scope of the present invention, as can the specific implementation of the output comparator circuitry. The scope of the present invention relates to the charging and discharging of a capacitor in response to a digital clock input, which generates a voltage ramp that is fed into comparators referenced to different voltage levels, thereby generating a plurality of outputs that are each delayed in different degrees from the digital clock input. These edges may be used to provide the specific timing relationships needed by many synchronous digital systems such as digital state machines.

Figure 3:
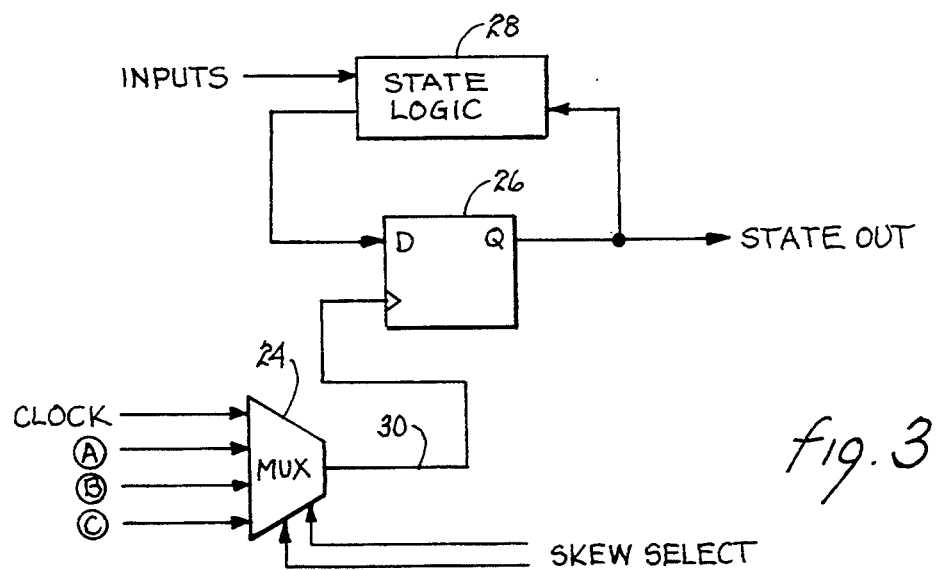
FIG. 3 is a block diagram showing one possible application for the circuit of FIG. 1.

The circuit of FIG. 3 shows one possible application for the circuit of the present invention. A multiplexer 24 is provided, which has inputs CLOCK, A, B and C that correspond to these same signals in FIG. 1. The inputs SKEW SELECT to the multiplexer 24 select one of the inputs to be routed to the output 30. This output 30 is used as a clock signal for a D flip-flop 26, which is an output stage of state logic 28. This sample circuit of FIG. 3 demonstrates how the circuit of the present invention shown in FIG. 1 can be used to provide several different clock sources which can be selected for clocking the D flip-flop 26. This allows the system designer a great deal of flexibility since the timing relationships required by the D flip-flop 26 and the State Logic 28 can be met by simply selecting the appropriate clock signal with the SKEW SELECT inputs.

While the invention has been described in its preferred embodiment, it is to be understood that the words which have been used are words of description rather than limitation, and that changes may be made within the purview of the appended claims without departing from the true scope and spirit of the invention in its broader aspects.

I claim:

1. A multiple digital clock edge generator circuit comprising, in combination:

input means coupled to a digital clock signal;

switching means coupled to said input means for enabling a charging circuit and a discharging circuit depending on the state of said input means wherein said discharging circuit being disabled and said charging circuit being enabled when said input means is in a first state and said charging circuit being disabled and said discharging circuit being enabled when said input means is in a second state;

capacitor means coupled to said charging circuit and to said discharging circuit for providing a voltage that increases when said switching means enables said charging circuit and that decreases when said switching means enables said discharging circuit; and comparator output means having an input coupled to said capacitor means for comparing said voltage on said capacitor means to a plurality of fixed reference voltages and for generating a plurality of outputs, each output of said plurality of outputs having a fixed delay from a rising clock edge of said digital clock signal on said input means to a corresponding clock edge of said output, and having a fixed delay from a falling clock edge of said digital clock signal on said input means to a corresponding clock edge of said output.

2. The circuit of claim 1 wherein said charging circuit comprising a constant current source coupled through said switching means to a power source to provide a constant current charge to said capacitor means when said switching means enables said charging circuit.

3. The circuit of claim 1 wherein said discharging circuit comprising a constant current source coupled through said switching means to a ground source to provide a constant current drain to said capacitor means when said switching means enables said discharging circuit.

4. The circuit of claim 1 wherein said plurality of fixed reference voltages in said comparator output means being generated by a plurality of connections to a resistor divider network coupled to a fixed voltage source.

5. The circuit of claim 1 wherein said fixed delay from said rising clock edge of said digital clock signal on said input means to at least one of said plurality of outputs of said comparator output means being generated by the time required to charge said capacitor means from an initial discharged voltage level to one of said plurality of fixed reference voltages.

6. The circuit of claim 1 wherein said fixed delay from said falling clock edge of said digital clock signal on said input means to at least one of said plurality of outputs of said comparator output means being generated by the time required to charge said capacitor means from an initial charged voltage level to one of said plurality of fixed reference voltages.

7. A method for generating multiple digital clock edges in response to a single clock input comprising the steps of:

provided input means coupled to a digital clock signal;

providing switching means coupled to said input means to enable a charging circuit and a discharging circuit depending on the state of said input means, said discharging circuit being disabled and said charging circuit being enabled when said input means is in a first state, and said charging circuit being disabled and said discharging circuit being enabled when said input means is in a second state;

providing capacitor means coupled to said charging circuit and to said discharging circuit, having a voltage that increases when said switching means enables said charging circuit, and that decreases when said switching means enables said discharging circuit; and providing comparator output means having an input coupled to said capacitor means for comparing said voltage on said capacitor means to a plurality of fixed reference voltages and for generating a plurality of outputs, each output of said plurality of outputs having a fixed delay from a rising clock edge of said digital clock signal on said input means to a corresponding clock edge of said output, and having a fixed delay from a falling clock edge of said digital clock signal on said input means to a corresponding clock edge of said output.

8. The method of claim 7 wherein said charging circuit comprising a constant current source coupled through said switching means to a power source to provide a constant current charge to said capacitor means when said switching means enables said charging circuit.

9. The method of claim 7 wherein said discharging circuit comprising a constant current source coupled through said switching means to a ground source to provide a constant current drain to said capacitor means when said switching means enables said discharging circuit.

10. The method of claim 7 wherein said plurality of fixed reference voltages in said comparator output means being generated by a plurality of connections to a resistor divider network coupled to a fixed voltage source.

11. The method of claim 7 wherein said fixed delay from said rising clock edge of said digital clock signal on said input means to at least one of said plurality of outputs of said comparator output means being generated by the time required to charge said capacitor means from an initial discharged voltage level to one of said plurality of fixed reference voltages.

12. The method of claim 7 wherein said fixed delay from said falling clock edge of said digital clock signal on said input means to at least one of said plurality of outputs of said comparator output means being generated by the time required to charge said capacitor means from an initial charged voltage level to one of said plurality of fixed reference voltages.

* * * * *